United States Patent [19]

Brahmbhatt

[11] Patent Number: 5,016,217

[45] Date of Patent: May 14, 1991

[54] LOGIC CELL ARRAY USING CMOS EPROM CELLS HAVING REDUCED CHIP SURFACE AREA

[75] Inventor: Dhaval J. Brahmbhatt, San Jose, Calif.

[73] Assignee: ICT International CMOS Technology, Inc., San Jose, Calif.

[21] Appl. No.: 488,405

[22] Filed: Feb. 26, 1990

Related U.S. Application Data

[63] Continuation of Ser. No. 194,785, May 17, 1988, abandoned.

[51] Int. Cl.$^5$ .............................................. G11C 11/34
[52] U.S. Cl. .................................... 365/185; 365/181; 365/189.08; 307/465
[58] Field of Search ........... 365/181, 184, 185, 189.08; 307/465, 469, 468, 23.5; 340/825.79, 825.83, 825.85, 825.86, 825.87, 825.90, 825.91, 825.93

[56] References Cited

U.S. PATENT DOCUMENTS

| | | | |
|---|---|---|---|
| 4,175,290 | 11/1979 | Harari | 365/181 X |
| 4,228,527 | 10/1980 | Gerber et al. | 365/181 X |
| 4,596,938 | 6/1986 | Cartwright, Jr. | 365/185 X |
| 4,686,558 | 8/1987 | Adam | 365/181 X |

FOREIGN PATENT DOCUMENTS

| | | | |
|---|---|---|---|
| 0121464 | 10/1984 | European Pat. Off. | 365/185 |
| 0064697 | 4/1983 | Japan | 365/181 |

Primary Examiner—Stuart N. Hecker
Assistant Examiner—Andrew L. Sniezek
Attorney, Agent, or Firm—Henry K. Woodward

[57] ABSTRACT

An Electrically Programmable Read Only Memory (EPROM) memory cell includes a serially connected Complementary Metal Oxide Silicon (CMOS) transistor pair having common floating gates and common control gates. A third n-type floating gate field effect transistor is utilized for programming the memory cell. The floating gate and the control gate of the third transistor are connected to the common floating gates and the common control gates, respectively, of the Complementary Metal Oxide Silicon (CMOS) transistor pair. The memory cell is tri-statable by connecting the source of the p-channel transistor of the Complementary Metal Oxide Silicon (CMOS) pair to the common control gates.

2 Claims, 2 Drawing Sheets

LOGIC CELL ARRAY USING CMOS EPROM CELLS HAVING REDUCED CHIP SURFACE AREA

This application is a Continuation of application Ser. No. 07/194,785, filed May 17, 1988, now abandoned.

BACKGROUND OF THE INVENTION

This invention is related to my copending application Ser. No. 07/087,143, filed Aug. 19, 1987, now U.S. Pat. No. 4,885,719 for IMPROVED LOGIC CELL ARRAY USING CMOS E² PROM CELLS.

This invention relates generally to application-specific integrated circuits (ASIC) and more particularly the invention relates to a logic cell array (LCA) ASIC.

ASIC devices are programmable integrated circuits which allow logic circuit designers speed and flexibility in designing logic arrays. Mask programmable gate arrays offer the highest degree of integration and flexibility, but have high, non-recurrent costs and require lengthy turn-around times. Field-programmable devices such as programmable array logic (PAL's) and programmable logic arrays (PLA's), and logic cell arrays (LCA's) provide faster turn-around at lower cost. However, the PAL and PLA implement only lower levels of integration with limited architectural flexibility.

The LCA is a reprogrammable device that implements complex digital logic functions and has logic capabilities equivalent to small arrays. The implementation of user logic inside the LCA is accomplished with writable memory (RAM) cells rather than dedicated integrated circuit masks (as with gate arrays) or programmable fuses (as with PAL's and PLA's). As described by Landry, "Logic Cell Arrays: High-Density, User-Programmable ASICs)," Technological Horizons, March 1986, the LCA produced by Xilinx Corporation consists of a matrix of configurable logic blocks which are arranged in rows and columns. Interleaved between rows and columns of the configurable logic blocks are user-definable interconnection resources (wiring paths) which provide the means for routing signals between the configurable logic blocks. Within each configurable logic block, a RAM is used to directly implement combinational logic functions, instead of the typical AND-/OR gating function found in PAL's and PLA's. Arranged along the outside perimeter of the LCA die and surrounding the matrix of configurable logic blocks are input/output blocks. From an architectural point of view of LCA closely resembles a gate array in its organization yet retains the features and advantages of field-programmable logic devices.

Each cell of the conventional LCA consists of six transistors which necessitates a considerable chip area for each cell. Further, the cell provides static memory and requires reprogramming upon loss of power.

Disclosed in my copending application Ser. No. 07/087,143, supra is a logic cell and array using CMOS E² PROM cells. The present invention is a similar cell and array which utilizes EPROM cells which are simpler in construction.

SUMMARY OF THE INVENTION

An object of the present invention is an improved application-specific integrated circuit.

Another object of the present invention is a logic cell requiring reduced chip surface area.

Yet another object of the present invention is a memory cell structure for a logic cell which provides an active output (O or $V_{cc}$) without the necessity of auxiliary circuitry.

A feature of the invention is a CMOS EPROM cell structure.

Briefly, each memory cell of an LCA in accordance with the invention includes CMOS transistor pair connected between $V_{cc}$ and circuit ground. The output of the cell is taken at the common terminal of the transistor pair. The two transistors have interconnected floating gates with programming means provided to selectively charge the floating gates for a "1" or "0" bit storage. Depending upon the stored bit, the output voltage from the cell will be Vcc or ground. The cell does not consume any DC power with the output being either Vcc or ground.

The EPROM cell is erased by the application of ultraviolet light. Programming of the cell is effected through a third floating gate transistor with the source and drain serially connected between a programming voltage and ground, with the floating gate of the third transistor interconnected with the floating gates of the CMOS transistor pair and with the control gate of the third transistor interconnected with the control gates of the CMOS transistor pair.

The cell structure is useful not only in an ASIC application but in other applications such as a redundant back-up memory and as a programmable switch.

The invention and objects and features thereof will be more readily apparent from the following detailed description and appended when taken with the drawings.

DETAILED DESCRIPTION OF ILLUSTRATIVE EMBODIMENT

Figure 1:
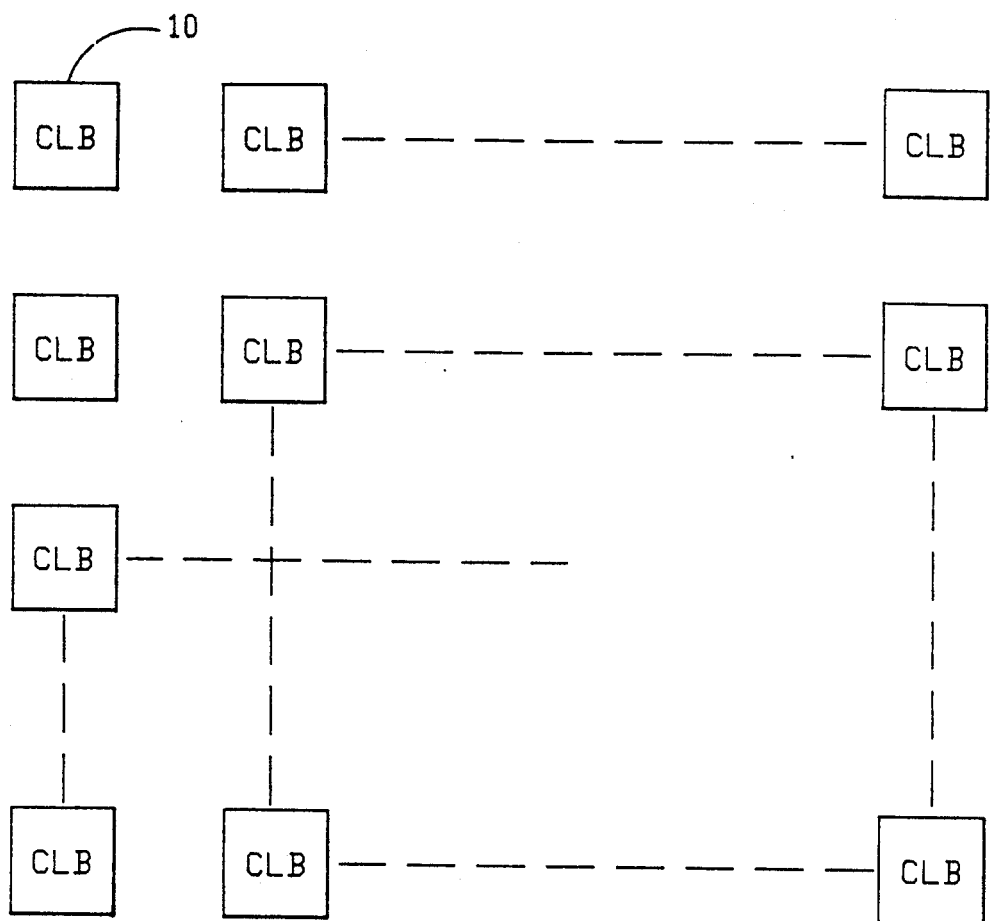
FIG. 1 is a functional block diagram of a logic cell array.

Referring now to the drawings, FIG. 1 is a schematic block diagram of a logic cell array. As described by Landry, supra, one commercially-available logic cell array comprises sixty-four configurable logic blocks (CLB) arranged in an eight-by-eight array as illustrated in FIG. 1. Each of the configurable logic blocks 10 in FIG. 1 consists of a combinational logic section with four general-purpose programming inputs, a storage element (flip-flop or latch) with a programmable clock input, and two programmable logic outputs. Each storage element, which can be either a D-type flip-flop or a gated transparent latch, includes a data input driven by the combinational logic function. As described above, the logic cell array commercially available from Xilinx Corporation utilizes a static memory cell consisting of six transistors, which necessarily require a considerable surface area on the integrated circuit. Further, the static cell loses data when power is lost and therefore just be reprogrammed.

Figure 2:
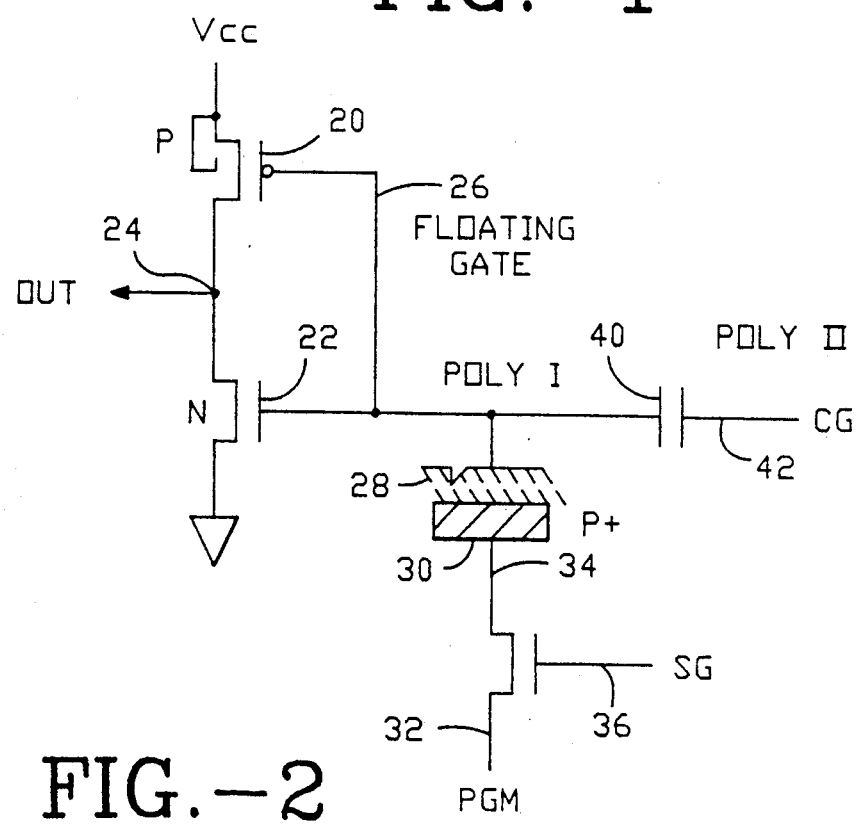
FIG. 2 is a schematic of a memory cell in accordance with my copending application, useful in the logic cell array of FIG. 1.

Disclosed in my copending application Ser. No. 07/087,143, supra, is an improved memory cell that requires at most three transistors. Two of the transistors comprise complementary metal oxide silicon (CMOS) electrically erasable ($E^2$) transistors. As illustrated in FIG. 2, the p-channel transistor 20 is connected to the +voltage source, $V_{cc}$, and the n-channel transistor 22 is connected to circuit ground. The output of the memory cell is taken at the common terminal 24 of the two transistors. The two CMOS transistors have a common floating gate 26 which can be electronically programmed by the tunnelling of electrons through a tunnel oxide 28 separating the floating gates from a p+ programming electrode 30. Electrode 30 is connected to a programming potential (PGM) 32 through an n-channel transistor 34. The gate of transistor 34 is connected to a select gate (SG) terminal 36.

The floating gates are coupled through capacitor 40 to a control gate (CG) electrode 42. In one embodiment of the circuitry using dual polysilicon conductive layers, the floating gate can comprise a poly 1 layer, and the control gate can comprise a poly 2 layer. The capacitor 40 is formed where the poly 2 layer overlies the poly 1 layer.

Figure 3:
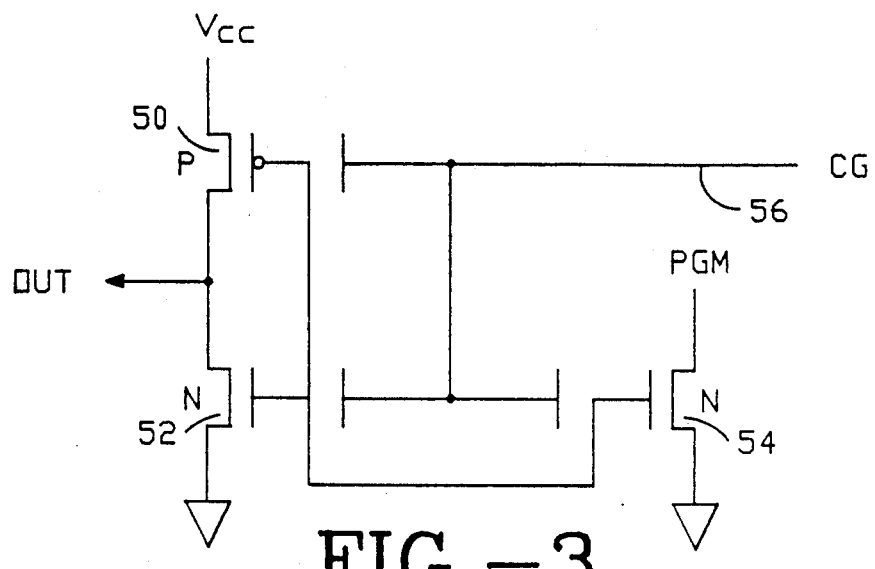
FIG. 3 is a schematic of a memory cell in accordance with the present invention, useful in the logic cell array of FIG. 1.

FIG. 3 is a schematic of an EPROM cell in accordance with the present invention. In this embodiment, the CMOS transistor pair including p-channel transistor and n-channel transistor 52 are serially connected between $V_{CC}$ and circuit ground. A programming transistor 54 comprising an n-channel floating gate transistor is serially connected between a programming voltage (PGM) and circuit ground with the floating gate of transistor 54 interconnected with the floating gates of transistors 50 and 52 and the control gate of transistor 54 interconnected with the control gates of transistors 50 and 52. The control gates are interconnected to the control gate (CG) voltage on line 56.

The cell structure of FIG. 3 is simpler than the cell structure of FIG. 2; however, a larger current is required in programming the cell of FIG. 3. Ultraviolet light is used to erase the EPROM cell by removing all charge from its floating gate. This is referred to the unprogrammed state. To program the cell by applying electrons to the floating gate, a PGM voltage of 8 volts is applied to transistor 54 while the control gate (CG) voltage is raised to 14 volts. $V_{CC}$ remains at +5 volts. In this state, hot electrons are injected into the floating gate of transistor 54, and thus to the floating gates of transistors 50 and 52, resulting in a net voltage of approximately −4 volts on the floating gate when the PGM voltage is removed. In this programmed state, the n-channel transistor is non-conductive and the p-channel transistor is conductive, thereby applying $V_{CC}$ (+5 volts) to the cell output.

Conversely, when the cell is unprogrammed and no charge is present on the floating gates, the nominal 5 volts applied as the control gate (CG) voltage is translated to the floating gate as approximately +4 volts which renders the p-channel transistor 50 non-conductive and the n-channel transistor 52 conductive. Therefore, in the unprogrammed state, ground (0 volt) is applied through n-channel transistor 52 to the cell output.

Figure 4:
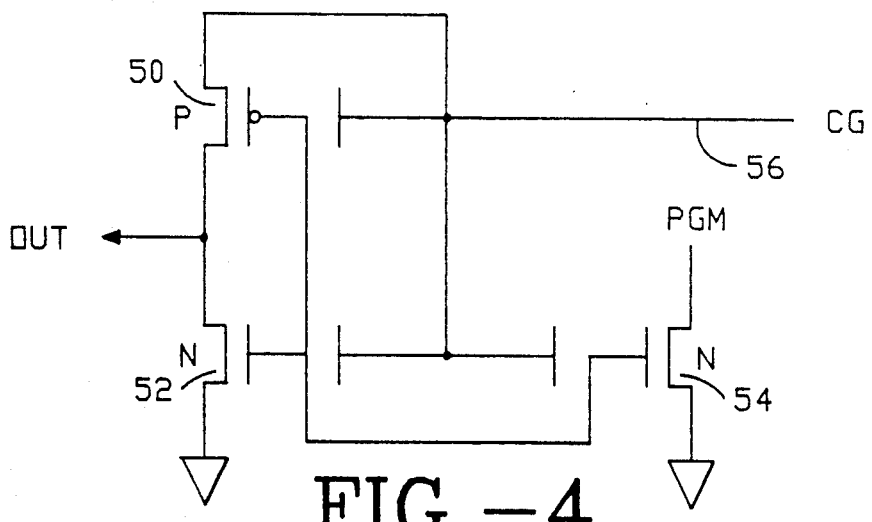
FIG. 4 is a schematic of an alternative embodiment of the cell of FIG. 3, functioning with a tri-state output.

FIG. 4 is a schematic of an alternative embodiment of the cell in accordance with the invention and operating with a tri-state output. In this embodiment, the source of p-channel transistor 50 is interconnected with the control gates of the CMOS transistor pair while the $V_{CC}$ voltage is connected to the n-doped well region of the p-channel transistor. The cell structure is programmed as the cell structure of FIG. 3 is programmed, and the cell structure provides a "1" and a "0" input when the CG voltage is +5 volts, similar to the operation of the cell structure of FIG. 3. However, when the CG line is grounded and no voltage is applied to the control gates of transistors 50 and 52, the output floats, i.e., the output is neither +5 volts nor grounded.

Figure 5:
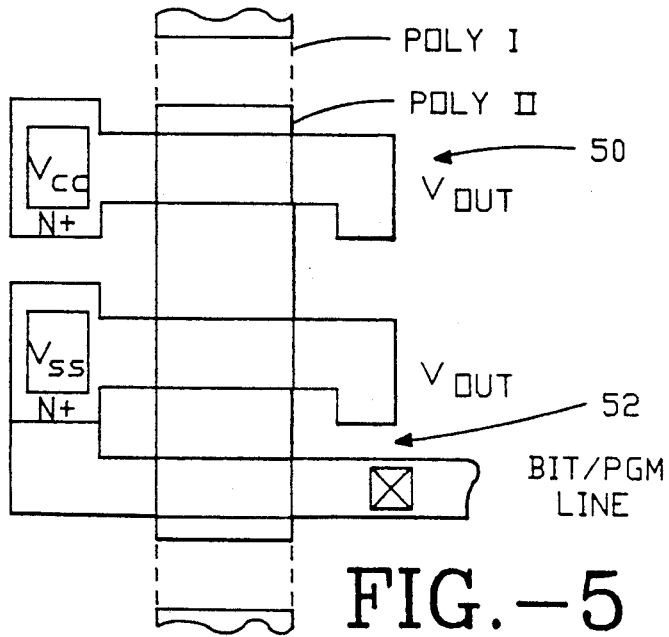
FIG. 5 is a plan view of the layout of the cell of FIG. 3 in a semiconductor chip.

FIG. 5 is a plan view of the layout of the cell of FIG. 3 in a semiconductor chip using a conventional dual polysilicon layer process. Like elements have the same reference numerals. The p-channel transistor 50 is formed in an n-well at the top of the cell, the n-channel transistor 52 is in the middle of the cell, and the output terminals of the two transistors are interconnected by metal layer (not shown). Floating gates of the two transistors comprise a first polysilicon layer (poly 1) and the control gates comprise a second, self-aligned polysilicon layer (poly-II) above and insulated from the poly 1 layer. Separate metal lines (not shown) are provided for $V_{CC}$, ground, and PGM. The poly 1 line is limited to each individual cell while the poly 2 line extends to adjacent cells.

The EPROM cell in accordance with the invention is similar to the $E^2$PROM cell disclosed in my copending application, supra, but the cell layout is smaller and simpler in construction.

While the invention has been described with reference to specific embodiments and applications, the description is illustrative of the invention and is not to be construed as limiting the invention. Various modifications and applications may occur to those skilled in the art without departing from the true spirit and scope of the invention as defined by the appended claims.

We claim:

1. A logic cell array comprising a plurality of configurable logic blocks arranged in rows and columns, each logic block including an ultraviolet light erasable EPROM memory cell, each EPROM memory cell having a serially connected CMOS transistor pair including a p-channel transistor having a source connected to a first terminal and an n-channel transistor having a source connected to a circuit ground potential, an output connected to a common terminal of said CMOS transistor pair, said CMOS transistor pair having a common floating gate and a common control gate, and means for selectively charging said common floating gate including an electrically programmable n-channel field effect transistor having a drain connected to a programming voltage terminal and a source connected to circuit ground potential, a floating gate connected to said common floating gate and a control gate connected to said common control gate, whereby said common floating gate receives electrons when positive voltages are applied to said programming voltage terminal and to said common control gate, said first terminal connected to said common control gate, each cell storing a "1" when said common control gate is at a positive voltage potential and said common floating gate has electrons stored thereon, each cell storing a "0" when said common control gate is at a positive voltage potential and said common floating gate has no electrons stored thereon, and each cell having a floating output when no positive voltage potential is applied to said common control gate.

2. An ultraviolet light erasable EPROM memory cell comprising a serially connected CMOS transistor pair including a p-channel transistor having a source connectable to a first terminal and an n-channel transistor having a source connectable to a circuit ground potential, and output connected to a common terminal of said CMOS transistor pair, said CMOS transistor pair having a common floating gate and a common control gate, and means for selectively charging said common floating gate including an electrically programmable n-channel field effect transistor having a drain connected to a programming voltage terminal and a source connected to circuit ground potential, a floating gate connected to said common floating gate and a control gate connected to said common control gate, whereby said common floating gate receives electrons when positive voltages are applied to said programming voltage terminal and to said common control gate, said first terminal connected to said common control gate, said cell storing a "1" when said common control gate is at a positive voltage potential and said common floating gate has electrons stored thereon, said cell storing a "0" when said common control gate is at a positive voltage potential and said common floating gate has no electrons stored thereon, and said cell having a floating output when no positive voltage potential is applied to said common control gate.

* * * * *